United States Patent [19]
Narusawa et al.

[11] Patent Number: 6,154,333
[45] Date of Patent: Nov. 28, 2000

[54] AMPLIFICATION CIRCUIT

[75] Inventors: Keiji Narusawa; Norio Shoji, both of Kanagawa, Japan

[73] Assignee: Sony Corporation, Tokyo, Japan

[21] Appl. No.: 09/213,414

[22] Filed: Dec. 17, 1998

[30] Foreign Application Priority Data

Jan. 19, 1998 [JP] Japan .................................. 10-007885

[51] Int. Cl.[7] ................................. G11B 5/02; H03F 3/45
[52] U.S. Cl. ............................................ 360/67; 330/252
[58] Field of Search .......................... 360/46, 67; 330/60, 330/62, 252, 261

[56] References Cited

U.S. PATENT DOCUMENTS

| | | | |
|---|---|---|---|
| 4,492,997 | 1/1985 | Arai et al. ............................... | 360/113 |
| 5,426,542 | 6/1995 | Smith ....................................... | 360/67 |
| 5,757,566 | 5/1998 | Ngo et al. ................................ | 360/67 |
| 6,066,987 | 5/2000 | Lorenz .................................... | 330/311 |

*Primary Examiner*—W. Chris Kim
*Attorney, Agent, or Firm*—Ronald P. Kananen; Rader, Fishman & Grauer

[57] ABSTRACT

An amplification circuit for an MR head which can realize a reduction of the power consumption, simplification of the circuit configuration by providing capacitors inside the circuit, and reduction of the number of externally provided parts, wherein a current is supplied to an MR head resistor from a bias current source and the amount of change of the head resistance is converted to a voltage change when reproducing magnetically recorded data. A direct current component of the voltage dropped in the head resistor is cut by capacitors, and only the alternating current component is input to a differential amplification circuit configured by transistors. Recorded data can be distinguished in accordance with an amplified output voltage, so capacitances of direct current cut-off capacitors can be set small and thus the direct current cut-off capacitors can be provided in the IC chip and the number of external parts can be reduced. Furthermore, since the base bias voltages of the transistors are set independently from the MR head, the power consumption can be reduced.

7 Claims, 2 Drawing Sheets

AMPLIFICATION CIRCUIT

BACKGROUND OF THE INVENTION

1. Field of the Invention

The present invention relates to an amplification circuit for a magneto-resistive (MR) head used for magnetically reproducing recorded data.

2. Description of the Related Art

As a head for reproducing data magnetically recorded in a hard disk drive (HDD) and the like, an MR head is known. The method of recording by an MR head reproduces data using the principle that a resistance changes in accordance with changes of a magnetic flux.

As a data reproducing method using an MR head, there is the current bias voltage sense method. In this method, a current is applied to the MR head to generate a voltage at the head. By sensing a change of the head voltage as the amount of change of a resistance of the MR head in response to the recorded data, reproduction of the recorded data is realized.

FIG. 1 is a circuit diagram of the configuration of an MR head and an amplification circuit for amplifying a head voltage in a data reproducing apparatus using the MR method.

As shown in the figure, a differential amplification circuit is configured by resistors RI and R2, transistors Q1 and Q2, a capacitor C2, and current sources IS1 and IS2. The capacitor C2 is connected between emitters of the transistors Q1 and Q2, and the current sources IS1 and IS2 are respectively connected to the emitters of the transistors Q1 and Q2 to supply a driving current to the transistors. The resistors R1 and R2 are respectively connected between collectors of the transistors Q1 and Q2 and the power source voltage Vcc to form a load for the transistors.

The two ends of a resistor of the MR head (hereinafter simply referred to as a head resistor) $R_{MR}$ are respectively connected to bases of the transistors Q1 and Q2. A bias current is supplied to the head resistor $R_{MR}$ by a bias current source $IS_B$. The series connected resistors R3 and R4 are connected in parallel to the head resistor $R_{MR}$. A connecting point of the resistors R3 and R4 is connected to a non-inverted (positive polarity) input terminal "+" of the differential amplification circuit AMP1 and an inverted (negative polarity) input terminal "−" is grounded. An output terminal of the differential amplification circuit AMP1 is connected to a base of the transistor Q3, a collector of the transistor Q3 is connected to the head resistor $R_{MR}$, and the emitter is connected via resistor C7 to a negative power source voltage $V_{ee}$. Furthermore, a capacitor C1 is connected between the base of the transistor Q3 and the negative power source voltage $V_{ee}$.

In the MR head and the amplification circuit therefor configured as above, for example, a bias current $i_B$ flows to the head resistor $R_{MR}$ by the bias current source $IS_B$ and the bias current $i_B$ flows to the negative power source voltage $V_{ee}$ via the transistor Q3.

When reading data, when defining an amount of change of a resistance of the head resistor $R_{MR}$ as $\Delta r$ in accordance with the recorded data, a voltage change of exactly ($i_B \times \Delta r$) occurs at the two ends of the head resistor $R_{MR}$. This amount of voltage change is amplified by the differential amplification circuit configured by the transistors Q1 and Q2 and so forth and an output voltage $V_{out}$ is output, therefore the recorded data can be read in accordance with a level of the output voltage $V_{out}$.

Since the MR head is easily affected by static electricity, it is necessary that the potential of the MR head be held close to the ground potential GND as much as possible. Accordingly, an intermediate potential of a potential difference $R_{MR}$ ($i_B \times r$) of the two ends of the head resistor is generated and a feedback circuit is configured by the differential amplification circuit AMP1 and the transistor Q3 so as to set the intermediate potential as close as possible to the ground potential GND. Note that r here represents a resistance of the head resistor $R_{MR}$. Also, the capacitor C1 is provided for phase compensation of the feedback circuit configured by the differential amplification circuit AMP1 and the transistor Q3.

Since the two ends of the head resistor $R_{MR}$ are connected to the bases of the transistors Q1 and Q2, the amount of voltage change ($i_B \times \Delta r$) caused by the change of the resistance of the head resistor $R_{MR}$ at the time of reproduction is amplified by the differential amplification circuit. Also, a direct current component of ($i_B \times r$) is constantly generated at the two ends of the head resistor $R_{MR}$, so that a direct current cut-off capacitor C2 is connected between the emitters of the transistors Q1 and Q2 configuring the differential amplification circuit.

Here, the resistors R3 and R4 have the same resistance. When a voltage drop ($i_B \times r$) caused at the head resistor $R_{MR}$ by the current value $i_B$ of the bias current source $IS_B$ is 500 mV, the potential at the terminal by which the head resistor $R_{MR}$ is connected to the collector of the transistor Q3 becomes about −250 mV. Accordingly, when defining a voltage between the base and emitter of the transistor Q2 as $V_{BE}$, an emitter potential of the transistor Q2 becomes ($-250-V_{BE}$) which is a negative potential, therefore the current sources IS1 and IS2 are connected so as to pass a current to the side of the negative power source voltage $V_{ee}$.

In the above MR head and the amplification circuit therefor of the related art, it is necessary to generate a large amount of current at the current sources IS1 and IS2 in order to reduce noise generated in the amplification circuit at the time of reproduction. This is because the shot-noise of a transistor can be expressed as a voltage generated at the base in the formula below.

$$\sqrt{\overline{e_n^2}} = \sqrt{2q \cdot V_T^2/Ic}\,[nV/\sqrt{H_z}] \tag{1}$$

Where, q represents a charge of an electron, $V_T = KT/q$,

K represents Boltzmann's constant,

T represents the absolute temperature, and $I_C$ represents a collector current of the transistor.

According to the formula (1), the larger a current flowing to the transistor, the smaller the noise generated. When increasing the transistor current, however, a load current flowing between the power source voltage $V_{cc}$ and the negative power source voltage $V_{ee}$ becomes large. As a result, there is a disadvantage that the power consumption increases.

Furthermore, in the differential amplification circuit configured by the transistors Q1 and Q2 and so forth, a high-pass filter (HPF) is formed by the capacitor C2 and emitter resistance $r_e$ of the transistors Q1 and Q2. For amplification, without major deterioration, of the necessary frequency components of a voltage change signal sensed by the head resistor $R_{MR}$, it is suitable that a cut-off frequency $f_c$, of the high-pass filter be 1/10 of the frequency component of the signal or less. The relationship of the cut-off frequency $f_c$ and the emitter resistance $r_e$ of the high-pass filter and the capacitor C2 is shown by the formula below:

$$f_c = 1/(2\pi \cdot 2r_e \cdot C_2)[H_z] \tag{2}$$

Here, when a frequency component $f_s$ of a signal is 5 MHz, a cut-off frequency $f_c$ is 500 kHz. Furthermore, when setting the Boltzmann constant $V_T$ to 26 mV and the collector currents $I_c$ of the transistors Q1 and Q2 to 5 mA, the emitter resistance $r_e$ of the transistors Q1 and Q2 becomes ($V_T/I_c$=5.2 Ω). The capacitor $C_2$ of the capacitor C2 can be obtained from the formula (2). Namely, $C_2$=32 nF can be obtained. Therefore, it is necessary to connect a large direct current cut-off capacitor C2 between the transistors Q1 and Q2 and to place the capacitor C2 outside the IC chip as an external part.

SUMMARY OF THE INVENTION

An object of the present invention is to provide an MR head and an amplification circuit therefor which can realize a reduction of the power consumption of a magnetic data reading circuit using an MR head, simplification of the circuit configuration by enabling the capacitor to be built in, and reduction of the external parts.

To achieve the above object, an amplification circuit of the present invention comprises a magneto-resistive (MR) head resistor with a resistance which varies in response to magnetically recorded data; a first current source for supplying a bias current having a predetermined value to the MR head resistor for biasing; a differential amplification circuit formed by a first transistor and a second transistor with collectors which are connected to loads and with emitters which are commonly connected and a second current source connected between the commonly connected point of the emitter and a ground potential supplying portion; a first capacitor connected between a first terminal of the MR head resistor and a base of the first transistor; and a second capacitor connected between a second terminal of the MR head resistor and a base of the second transistor.

Preferably, the first and second capacitors are formed in an IC chip.

More preferably, there are provided first and second resistors connected in series between the first and second terminals of the MR head resistor, a differential amplification circuit with an input terminal which is connected to the connecting point of the first and second resistors and with an inverted input terminal which is connected to the ground potential, and a third transistor with a base which is connected to an output terminal of the differential amplification circuit, a collector which is connected to the second terminal of the MR head resistor, and an emitter which is connected to a second power source voltage.

More preferably, the second power source voltage is set lower than the ground potential. Also, the current source supplying a bias current to the MR head resistor is connected between the first power source voltage which is set higher than the ground potential and the first terminal of the MR head resistor.

According to the present invention, the amount of change of the resistance is converted to a change of the potential difference of the two ends of the head resistor by the MR head resistor wherein the resistance changes in accordance with the magnetically recorded data. The potential difference of the head resistor is amplified and output by the differential amplification circuit configured by the first and second transistors, so that the recorded data can be distinguished by the output signal of the amplification circuit.

The direct current component of the voltage generated at the two ends of the head resistor is cut and only the alternating current component showing the amount of change of the voltage is input to the differential amplification circuit by the head resistor and the first and second capacitors connected between the bases of the first and second transistors. Furthermore, according to the present invention, since it is possible to lower the capacitance of the direct-current cut-off capacitor, the capacitor can be placed inside the IC chip.

As a result, the IC chip can be made compact, the circuit configuration can be simplified by reducing the number of external parts, and the cost of an apparatus for reproducing magnetically recorded data can be reduced.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 1:
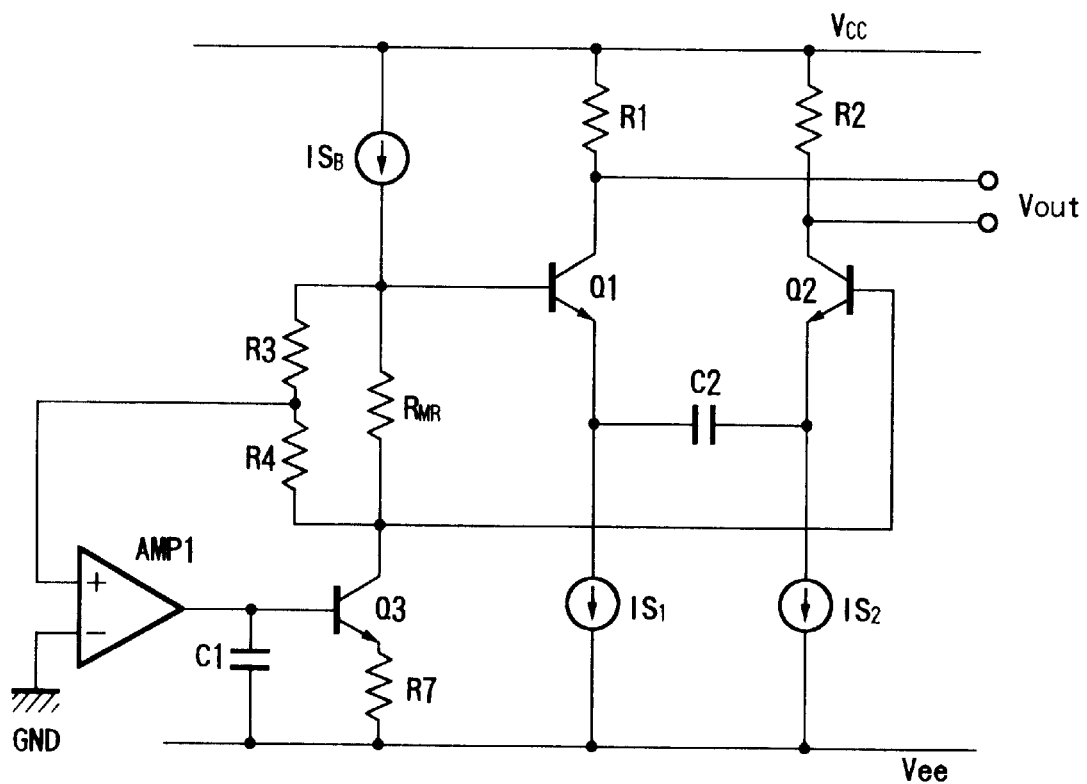
FIG. 1 is a circuit diagram of an example of an amplification circuit for an MR head resistor according to the related art.
Figure 2:
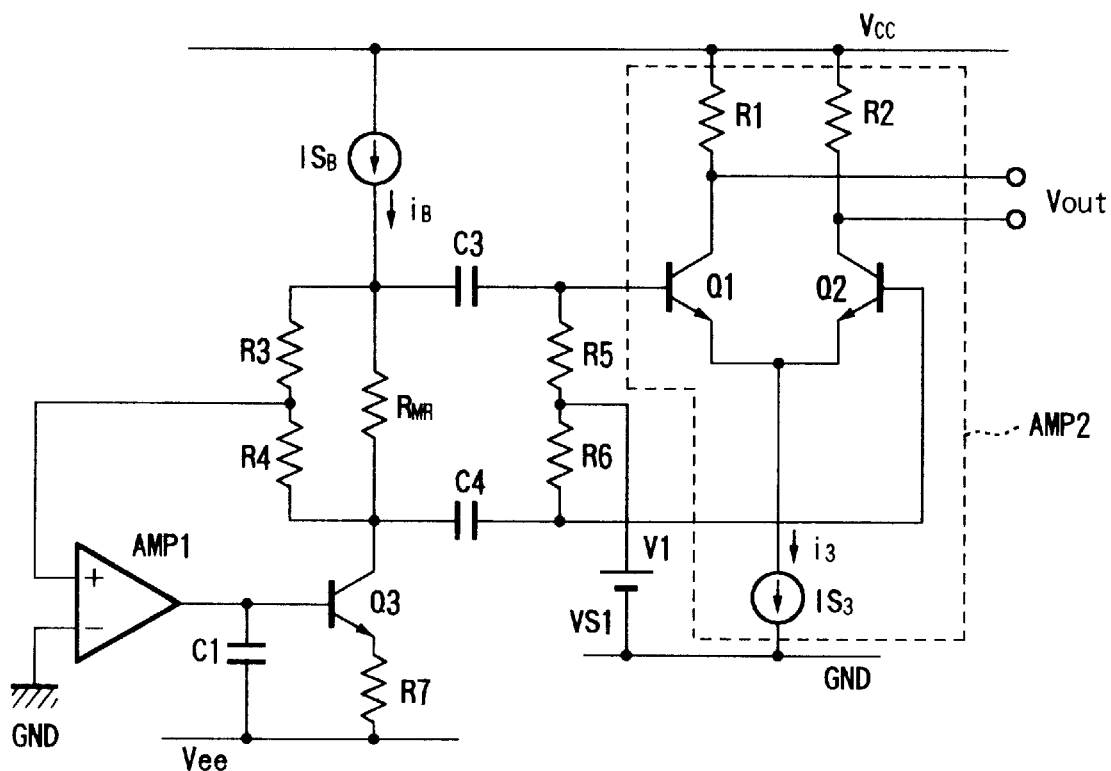
FIG. 2 is a circuit diagram of an embodiment of an amplification circuit for an MR head resistor according to the present invention.

FIG. 2 is a circuit diagram of an embodiment of an MR head resistor and an amplification circuit using it according to the present invention.

In the present invention, as shown in the figure, a differential amplification circuit AMP2 is configured by transistors Q1 and Q2, resistors R1 and R2, and a current source IS3. One terminal (first terminal) of the MR head resistor $R_{MR}$ is connected to a bias current source $IS_B$. A bias current is supplied from the bias current source $IS_B$. The other terminal (second terminal) of the MR head resistor $R_{MR}$ is connected to a collector of a third transistor Q3.

The two terminals of the head resistor $R_{MR}$ are connected to bases of the transistors Q1 and Q2 via capacitors C3 and C4. In the differential amplification circuit AMP2, emitters of the transistors Q1 and Q2 are connected to each other and a current source IS3 is connected to the connecting point. Collectors of the transistors Q1 and Q2 are respectively connected to a power source voltage $V_{cc}$ via the resistors R1 and R2.

Furthermore, resistors R5 and R6 are connected in series between the bases of the transistors Q1 and Q2 and a connecting point of the resistors R5 and R6 is connected to a power source voltage VS1.

Resistors R3 and R4 are connected in series between the two terminals of the MR head resistor $R_{MR}$. The connecting point of the resistors R3 and R4 are connected to an input terminal "+" of the differential amplification circuit AMP1, and an inverted input terminal "−" of the differential amplification circuit AMP1 is grounded.

An output terminal of the differential amplification circuit AMP1 is connected to a base of the transistor Q3, and an emitter of the transistor Q3 is connected to the negative power source voltage $V_{ee}$ via a resistor R7.

Below, the operation of the MR head and amplification circuit having the above configuration will be explained.

In the present embodiment, as shown in FIG. 2, a direct current cut-off capacitor for cutting a direct current component of a voltage signal generated at the MR head resistor $R_{MR}$ is not connected between emitters of the transistors Q1 and Q2, but is provided both between the two terminals of the head resistor $R_{MR}$ and the bases of the transistors Q1 and Q2.

When reproducing data, a resistance r of the MR head resistor $R_{MR}$ changes in accordance with the recorded data. Here, the amount of change is referred to as Δr. Since a bias current $i_B$ is supplied to the head resistor $R_{MR}$ by a bias current source $IS_B$, a change of the resistance of the head resistor $R_{MR}$ appears as a potential difference ($i_B$×Δr) of the two ends. The potential difference ($i_B$×Δr) of the two ends of the head resistor $R_{MR}$ is amplified by the differential amplification circuit AMP2 and output to the outside the circuit as an output voltage $V_{out}$. Therefore, the recorded data can be distinguished by the output voltage $V_{out}$ of the differential amplification circuit AMP2.

Although the direct current component of ($i_B$×r) was generated at the two ends of the head resistor $R_{MR}$, the direct current component is cut by the direct current cut-off capacitors C3 and C4 and only the alternating current component ($i_B$×Δr) is applied between the bases of the transistors Q1 and Q2 in the differential amplification circuit AMP2.

Since the MR head is easily affected by static electricity, it is necessary that the potential of the MR head be held at the ground potential GND or close to it. Accordingly, the intermediate potential of a potential difference ($i_B$×r) of the two ends of the head resistor is generated and a feedback circuit is configured by the differential amplification circuit AMP1 and the transistor Q3 so as to set the intermediate potential as close as possible to the ground potential GND. The capacitor C1 is provided for phase compensation of the feedback circuit configured by the differential amplification circuit AMP1 and the transistor Q3.

A cut-off frequency $f_c$ of a high pass filter formed by the direct current cut-off capacitor and base input resistances of the transistors Q1 or Q2 can be obtained by the following formula:

$$f_c=1/(2\pi \cdot C_3 r_{in1})[\text{Hz}] \quad (3)$$

or $$f_c=1/(2\pi \cdot C_4 r_{in2})[\text{Hz}] \quad (4)$$

In the formula (3), $r_{in2}$ represents a parallel resistance of the resistor R5 and a base input resistance of the transistor Q1, and $r_{in2}$ represents a parallel resistance of the resistor R6 and a base input resistance of the transistor Q2. Note, if the transistors Q1 and Q2 have almost the same electrical properties, the base input resistance $r_{bin}$ can be given by the following formula:

$$r_{bin}=h_{fe} \cdot V_T/I_C \quad (5)$$

Here, $h_{fe}$ represents a current amplification ratio of the transistor, $V_T$ represents the Boltzmann constant, and $I_C$ represents a collector current of a transistor.

When setting a current amplification ratio $h_{fe}$ of the transistors Q1 and Q2 to 400, the Boltzmann constant to 26 mV, and the collector current $I_C$ of both the transistors Q1 and Q2 to 5 mA, the base input resistance of the transistors Q1 and Q2 becomes about 2.08 mΩ by the formula (4). Furthermore, when setting the resistances of the resistors R5 and R6 equally to 10 kΩ, in order to set the cut-off frequency $f_c$ to 500 kHz, the capacitances $C_3$ and $C_4$ of the capacitors C3 and C4 become about 185 pF by the formula (3).

As explained above, in the present invention, instead of providing a direct current cut-off capacitor between the emitters of the transistors Q1 and Q2 forming the differential amplification circuit AMP2, direct current cut-off capacitors are provided respectively between the terminals of the MR head resistor $R_{MR}$ and the bases of the transistors Q1 and Q2. As a result, it is possible to lower the capacitance of the direct current cut-off capacitor in the present embodiment and to place it inside the IC chip. Therefore, it is not necessary to provide a terminal for connecting the capacitor outside the IC chip, so the IC chip can become compact, the circuit configuration can be simplified due to the reduction of the number of external parts, and the cost can be reduced.

Also, since it is possible to determine the base bias potential of the transistors Q1 and Q2 regardless of the potential of the MR head, the current source IS3 can pass a current from the connecting point of the emitters of the transistors Q1 and Q2 to the ground potential GND. As a result, the power consumption for ($V_{ee}$×$i_3$) can be reduced. Here, for example, when setting the negative power source voltage $V_{ee}$ to −5V and the current value $i_3$ of the current source IS3 to 10 mA, a reduction of the power consumption of 50 mW can be attained.

As explained above, according to the present embodiment, a current $i_B$ is supplied to the MR head resistor $R_{MR}$ by the bias current source $IS_B$ and the amount of change of the head resistor $R_{MR}$ is converted to a voltage change at the time of reproducing magnetically recorded data. The direct current component of the voltage dropped in the head resistor $R_{MR}$ is cut by the capacitors C3 and C4, and only the alternating current component is input to the differential amplification circuit AMP2 configured by the transistors Q1 and Q2. Reproduction of the recorded data can be distinguished in accordance with the amplified output voltage $V_{out}$ so that it is possible to lower the capacitances of the direct current cut-off capacitors C3 and C4 and to place them inside an IC chip, thus the external parts can be reduced. Furthermore, since the base bias voltage of the transistors Q1 and Q2 can be set regardless of the head resistance, a reduction of the power consumption can be realized.

As explained above, according to the amplification circuit for a head resistor of the present invention, the number of terminals of an IC chip forming an apparatus for reproducing magnetically recorded data can be reduced and the IC chip can be made compact. Furthermore, the number of externally provided parts can be reduced, so that simplification of the circuit as well as lower cost can be realized.

Also, according to the present invention, there is the advantage that a reduction of the power consumption of an apparatus for reproducing magnetically recorded data can be realized.

Note that the present invention is not limited to the above embodiments and includes modifications within the scope of the claims.

What is claimed is:

1. An amplification circuit comprising:
   a magneto-resistive (MR) head resistor with a resistance which varies in response to magnetically recorded data;
   a first current source for supplying a bias current having a predetermined value to the MR head resistor for biasing;
   a first differential amplification circuit formed by a first transistor and a second transistor, with collectors which are connected to loads and with emitters which are commonly connected;

a second current source connected between the commonly connected point of the emitters and a ground potential supplying portion;

a first capacitor connected between a first terminal of the MR head resistor and a base of the first transistor; and a second capacitor connected between a second terminal of the MR head resistor and a base of the second transistor.

2. An amplification circuit as set forth in claim 1, wherein the first and second capacitors are formed in an IC chip.

3. An amplification circuit as set forth in claim 1, further comprising:

first and second resistors connected in series between the first and second terminals of the MR head resistor, a second differential amplification circuit with an input terminal which is connected to the connecting point of the first and second resistors and with an inverted input terminal which is connected to the ground potential, and a third transistor with a base which is connected to an output terminal of the second differential amplification circuit, with a collector which is connected to the second terminal of the MR head resistor, and with an emitter which is connected to a second power source voltage.

4. An amplification circuit as set forth in claim 3, wherein the second power source voltage is set lower than the ground potential.

5. An amplification circuit as set forth in claim 3, comprising a third capacitor connected between a base of the third transistor and the second power source voltage.

6. An amplification circuit as set forth in claim 1, wherein the current source for supplying a bias current to the MR head resistor is connected between the first power source voltage and the first terminal of the MR head resistor.

7. An amplification circuit as set forth in claim 6, wherein the first power source voltage is set higher than the ground potential.

* * * * *